(12) United States Patent
Wu

(10) Patent No.: US 6,190,977 B1
(45) Date of Patent: Feb. 20, 2001

(54) METHOD FOR FORMING MOSFET WITH AN ELEVATED SOURCE/DRAIN

(75) Inventor: Shye-Lin Wu, Hsinchu (TW)

(73) Assignee: Texas Instruments - Acer Incorporated, Hsinchu (TW)

(*) Notice: Under 35 U.S.C. 154(b), the term of this patent shall be extended for 0 days.

(21) Appl. No.: 09/439,431

(22) Filed: Nov. 15, 1999

Related U.S. Application Data

(63) Continuation-in-part of application No. 09/303,143, filed on Apr. 30, 1999.

(51) Int. Cl.$^7$ ................................................. H01L 21/336
(52) U.S. Cl. .................... 438/300; 438/303; 438/301; 438/305; 438/649; 438/564; 438/158; 437/35
(58) Field of Search ..................... 438/300, 303, 438/564, 305

(56) References Cited

U.S. PATENT DOCUMENTS

| | | | |
|---|---|---|---|
| 5,733,792 | * | 3/1998 | Masuoka ................................ 437/35 |
| 5,902,125 | * | 5/1999 | Wu ....................................... 438/300 |
| 6,046,090 | * | 4/2000 | Wu ....................................... 438/303 |
| 6,090,691 | * | 7/2000 | Ang et al. ............................. 438/564 |
| 6,100,145 | * | 8/2000 | Kepler et al. ........................ 438/300 |
| 6,100,161 | * | 8/2000 | Yu et al. .............................. 438/424 |
| 6,110,767 | * | 8/2000 | Wu ....................................... 438/158 |
| 6,110,786 | * | 8/2000 | Gardner et al. ...................... 438/300 |
| 6,110,787 | * | 8/2000 | Chan et al. .......................... 438/300 |

* cited by examiner

*Primary Examiner*—John F. Niebling
*Assistant Examiner*—Olivia T Luk

(57) ABSTRACT

A gate insulator layer is formed over the semiconductor substrate and a first silkcon layer is then formed over the gate insulator layer. An first dielectric layser is formed over the first silicon layer. A gate region is defined by removing a portion of the gate insulator layer, of the first silicon layer, and of the first dielectric layer. A doping step using low energy implantation or plasma immersion is carried out to dope the substrate to form an extended source/drain junction in the substrate under a region uncovered by the gate region. An undoped spacer structure is formed on sidewalls of the gate region and a second silicon layer is formed on the semiconductor substrate. The first dielectric layer is then removed and another doping step is performed to dope the first silicon layer and the second silicon layer. A series of process is then performed to form a metal silicide layer on the first silicon layer and the second silicon layer and also to diffuse and activate the doped dopants.

19 Claims, 3 Drawing Sheets

METHOD FOR FORMING MOSFET WITH AN ELEVATED SOURCE/DRAIN

CROSS REFERENCE TO RELATED APPLICATIONS

This invention is a continuation-in-part application of an application filed under the title of "METHOD TO FORM MOSIFET WITH AN ELEVATED SOURCE/DRAIN FOR PMOSFETs" with the Ser. No. of 09/303,143 filed at Apr. 30, 1999, which is assigned to same assignee with the same inventor as the present application.

FIELD OF THE INVENTION

The present invention relates to the manufacturing of transistors in the semiconductor fabrication, and more specifically, to a method for forming a metal oxide semiconductor field effect transistor (MOSFET) having an elevated source/drain.

BACKGROUND OF THE INVENTION

From the first invention of integrated circuits at 1960, the number of devices on a chip has grown in an explosive increasing rate. The teclmologies of the semiconductor industry has been researched continuously for almost four decades. The progress of the semiconductor integrated circuits has step into ULSI (ultra large scale integration) level or even higher level. The capacity of a single semiconductor chip increases from several thousand devices to hundreds of million devices, or even billions of devices. The integrated circuits devices like the transistors, the capacitors, and the connections must be greatly narrowed simultaneously.

The increasing packing density of the integrated circuits generates numerous challenges to the semiconductor manufacturing process. Every device needs to be formed within smaller size without damaging the characteristics and the operations of integrated circuit devices. The demands on high packing density, low heat generation, and low power consumption devices with good reliability and long operation life must be maintained without any degradation in their functions. These achievements are expected to be reached with the five key aspects of the semiconductor manufacturing, including the photography, the etching, the deposition, the ion implantation, and the thermal processing technologies. The continuous increase in the packing density of the integration circuits must be accompanied with a smaller feature size. With the present semiconductor manufacturing technology, the processes with generally a quarter micrometer in size is widely utilized. For making the next generation devices, the technologies focusing mainly on one-tenth micrometer and even nanometer feature sizes are highly required.

Transistors, or more particularly the metal oxide semiconductor field effect transistors (MOSFET), are the most important and frequently employed devices. The MOSFET is widely employed in the integrated circuits with it's high performance. However, with the continuous narrowing of the device size, the sub-micron scale MOS transistors have to face many risky challenges. As the MOS transistors become narrower and thinner accompanying with shorter channels, the problems like the junction punchthrough, the leakage, and the contact resistance cause the reduction in the yield and the reliability of the semiconductor manufacturing processes.

For developing future MOSFET devices with a sub-micrometer or even smaller feature size, the ultra shallow junctions are required to suppress the short channel effects encountered with the down scaling sizes. On the other hand, new challenges arise with a narrowed size. The preparation of an extremely shallow source/drain junction is much harder. The conventional ion implantation process is unable to form a shallow junction with high dopant concentration.

In the work proposed by K. Takeuchi et al. ("Iligh performance sub-tenth micron CMOS using advanced boron doping and $WSi_2$ dual gate process", in 1995 Symposium on VLSI Technology Digest of Technical Papers), the problem is addressed. The ion implantation is hard to form shallow and high concentration source/drain. The defect-induced anomalous diffusion of boron in the channel region becomes a problem. Local boron depletion near the source/drain junctions will directly enhance short channel effects. A CMOS fabrication method is also disclosed in their work.

In addition, a device degradation problem is found to come from the boron penetration into the thin gate oxide with the formation of a doped polysilicon gate. S. L. Wu (the inventor of the present invention), C. L. Lee, and T. F. Lai submit the problem in their work "Suppression of Boron Penetration into an Ultra-Thin Gate Oxide ($\leq 7$ nm) by Using a Stacked-Amorphous-Silicon (SAS) Film" (IEDM 93-329 1993 IEEE). The p+polysilicon has been widely used as the gate material of pMOSFET to avoid the short-channel effects. The $BF_2$-implant is typically used in forming both the gate and the junction.

However, in the conventional arts in forming the transistors, the Fincorporation will enhance the boron penetration through the thin gate oxide into the silicon substrate. The penetration also results in a large threshold voltage shift. A SAS gate structure is proposed to suppress the F-incorporation-induced boron penetration effect in their work.

SUMMARY OF THE INVENTION

A method of forming a metal oxide semiconductor field effect transistor (MOSFET) with an elevated source/drain is provided in the present invention. The short channel effects can be suppressed with the elevated junction. An extended ultra-shallow source/drain junction is formed by a plasma immersion process or a low energy implantation. The effects accompanying with the small feature size devices are eliminated by the extended ultra-shallow junction.

The method of the present invention in forming a transistor, more specifically a MOSFET, on a semiconductor substrate includes the following steps. A gate insulator layer is formed over the semiconductor substrate and a first silicon layer is then formed over the gate insulator layer. An first dielectric layer is formed over the first silicon layer. A gate region is defined by removing a portion of the gate insulator layer, of the first silicon layer, and of the anti-reflection layer. A doping step using low energy implantation or plasma immersion is carried out to dope the substrate to form an extended source/drain junction in the substrate under a region uncovered by the gate region.

An undoped spacer structure is formed on sidewalls of the gate region and a second silicon layer is formed on the semiconductor substrate. The first dielectric layer is then removed and another doping step is performed to dope the second silicon layer for forming a source/drain junction in the substrate under a region uncovered by the gate region and the undoped spacer structure.

A series of process is then performed to form a metal silicide layer on the gate region and the source/drain junction region. At first, a metal layer is formed over the semiconductor substrate, and a thermal process is then performed to the semiconductor substrate, in order to diffuse and activate dopants in the extended source/drain junction and in the second silicon layer to form the source/drain junction, and also to form a metal silicide layer on the second silicon layer and the first silicon layer. Finally, the unreacted portion of the metal layer is removed.

In the preferred embodiments, a step of thermally growing a second dielectric layer on the substrate is carried out after the doping step for forming an oxynitride layer around the gate region and the gate insulator layer to reduce the dopant penetration or contamination to the gate insulator layer.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings, wherein.

DETAILED DESCRIPTION OF THE PREFERRED EMBODIMENT

A method of forming a metal oxide semiconductor field effect transistor (MOSFET) having an elevated source/drain is provided in the present invention. The elevated source/drain junction is formed through the deposition of a second silicon layer. The short charniel effect is suppressed by using the elevated junction. The proposed method provide a gate structure with a metal silicide contact on top. An extended ultra-shallow source/drain junction is formed by using a plasma immersion process or a low energy implantation. The hot electron effect is eliminated by the extended ultra-shallow junction.

The method and the steps in the present invention applied on a semiconductor wafer can create different types of transistors and numerous devices at a time. For a clear illustration, the steps for forming mainly a single MOS transistor are illustrated. Since the variations in the processes for incorporating the formation of the other types of transistors are well known in the art, the details are not described.

Figure 1:
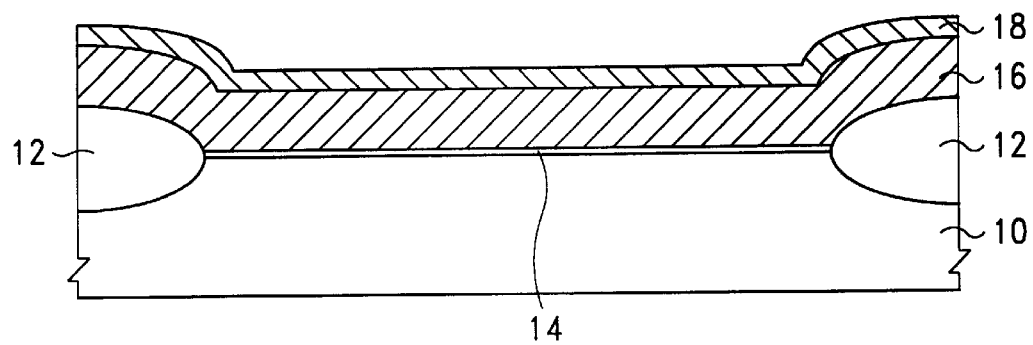
FIG. 1 illustrates a cross sectional view of the formation of a gate insulator layer, a first silicon layer, and a first dielectric layer over the semiconductor substrate in accordance with the present invention.

Referring to FIG. 1, a semiconductor substrate 10 is provided. As an example, the semiconductor substrate 10 is a silicon substrate with a crystalline direction of <100>. Substrates of other materials or of different crystalline directions can be utilized alternatively under different needs. An isolation region using field oxide isolation 12 or other isolation technology like trench isolation (not shown) is formed on the semiconductor substrate 10.

As an example, a process of forming field oxide isolation 12 is illustrated. In general, a thin silicon oxide layer, is thermally grown on the semiconductor substrate 10 with the thickness in the range of about 20 angstroms to 300 angstroms. A silicon nitride layer, which is not shown in the figure, is then deposited thereon. The silicon nitride layer is utilized as a layer for inhibiting the field oxide growth on an active region of the semiconductor substrate 10. The silicon nitride layer is then patterned to etch off the region for forming the field oxide isolation 12. The semiconductor substrate 10 is subjected to a thermal process, as an example, a thermal process performed in a steam and oxygen containing ambient. The region uncovered by the silicon nitride layer is grown to as the field oxide isolation 12. The silicon nitride layer is than removed using etchants like hot phosphoric acid solution. The pad layer under the silicon nitride layer can also be removed. The isolation region 12 can be created through other isolation technologies which are known in the art, like trench isolation and so on, with the same purpose in defining respective active regions.

As shown in FIG. 1, a gate insulator layer 14, like a silicon oxide layer or a silicon oxynitride layer is formed. The silicon oxide can be grown thermally in an oxygen containing ambient and the silicon oxynitride can be grown thermally in an oxygen and nitrogen containing ambient, such as an NO or $N_2O$ ambient. In the case, the gate insulator layer 14 is grown from the semiconductor substrate 10 with a thickness between about 15 angstroms to 300 angstroms.

A first silicon layer 16 is then formed over the gate insulator layer 14. Preferably, an undoped polysilicon layer or a lightly-doped polysilicon layer can be deposited as the first silicon layer 16. The undoped or lightly-doped polysilicon layer 16 can be formed by chemical vapor deposition with a thickness of about 300 angstroms to 4000 angstroms, and preferably deposited with in-situ doped dopants in the case for forming a lightly-doped polysilicon. With the reduced dopant concentration in the first silicon layer 16, the formation of the undoped or lightly-doped polysilicon layer 16 subsequently over the gate insulator layer 14 can eliminate the problem of the gate insulator degradation under the penetration of dopants. A first dielectric layer 18 is formed over the polysilicon layer 16. The first dielectric layer 18 can be a silicon oxide layer in the case. The silicon oxide layer can be formed by a chemical vapor deposition (CVD) or a plasma-enhanced chemical vapor deposition (PECVD). In the preferred embodiments, the thickness of the first dielectric layer 18 is about 300 to 1500 angstroms.

Figure 2:
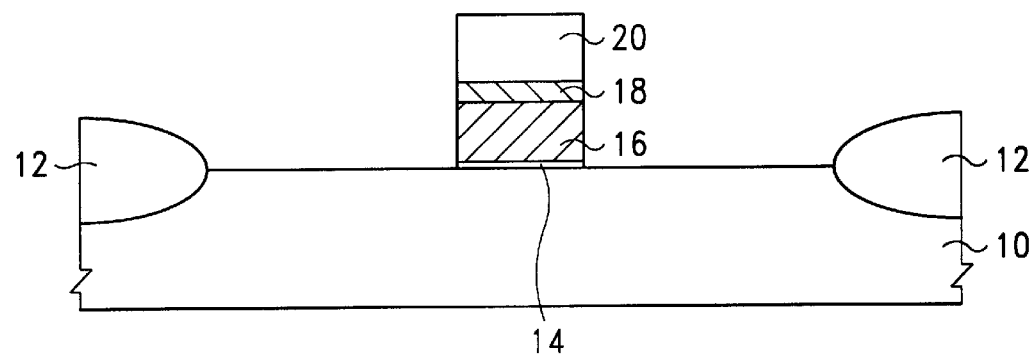
FIG. 2 illustrates a cross sectional view of removing a portion of the gate insulator layer, of the first silicon layer. and of the first dielectric layer for defining a gate region in accordance with the present invention.

A gate region is formed by a series steps to remove a portion of the gate insulator layer 14, of the polysilicon layer 16, and of the first dielectric layer 18, as shown in FIG. 2. A lithography and an etching process can be applied in doing the patterning work. A photoresist layer 20 is formed and patterned for defining a gate pattern. The gate insulator layer 14, the polysilicon layer 16, and the first dielectric layer 18 can be sequentially removed with a reactive ion etching (RIE) under the generation of plasma, using the gate pattern as a mask. The photoresist layer 20 is then removed after the gate region is defined.

Figure 3:
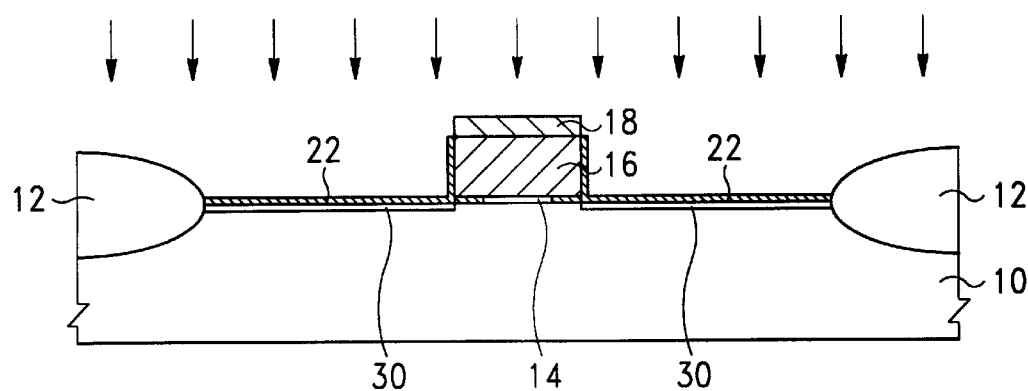
FIG. 3 illustrates a cross sectional view of doping the substrate to form an extended source/drain junction in the substrate under a region uncovered by the gate region in accordance with the present invention.

Next, a doping step is carried out to dope the substrate 10 to form an extended source/drain junction 30 in the substrate 10 under a region uncovered by the gate region, as shown in FIG. 3. For forming an ultra-shallow extended source drain junction, a low energy implantation or a plasma immersion process is preferably employed in the case. The plasma immersion process can be performed in a plasma environment with the presence of phosphorus or arsenic ions in the case of forming nMOSFETs, or boron ions in the case of forming pMOSFETs. In the case of forming nMOSFETs, the low energy implantation process can be performed by implanting phosphorus or arsenic ions at an energy between about 0.1 to 5 KeV, preferably for having a dosage of about 1E13 to 1E15 ions/cm$^2$. Alternatively, boron ions can employed to replace phosphorus or arsenic ions in the methods mentioned above to fabricate pMOSFETs.

After the extended source/drain junction is formed, an optional step of thermally growing a second dielectric layer 22 from the substrate is preferably performed. In the case, an oxynitride or oxide film thermally grown from the semiconductor substrate 10 and the first silicon layer 16, in an oxygen and/or nitrogen containing gas ambient, like a $O_2$, $N_2O$ or NO ambient, is utilized as the second dielectric layer 22. The oxynitride or oxide film 22 is also grown on the sidewalls of the gate insulator layer 14 by the diffusion of silicon atoms through the gate insulator layer 14 from the semiconductor substrate 10. The thin oxynitride or oxide film can be grown with an ultra-thin thickness between about 5 angstroms to 100 angstroms. The formation of the oxynitride or oxide film 22 by consuming surface silicon material recovers the etching damage on the surface of the semiconductor substrate 10.

Figure 4:
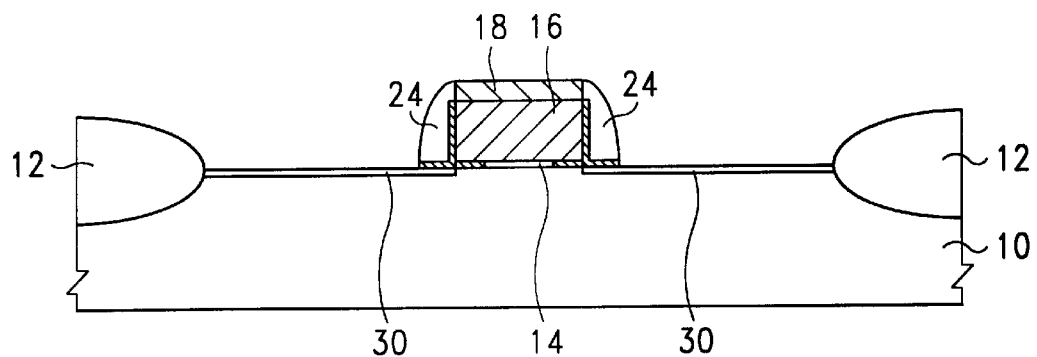
FIG. 4 illustrates a cross sectional view of the formation of a sidewall structure on the sidewalls of the gate region in accordance with the present invention.

Turning to FIG. 4, an undoped sidewall structure 24 is formed on sidewalls of the gate region. A series of steps can be employed in forming the undoped spacer structure 24 on the gate region. In the present embodiment, silicon nitride spacers can be formed by sequentially depositing and etching back a silicon nitride layer. In the etching back process, the first dielectric layer 18 of silicon oxide serves as a good etch stop layer to prevent the etch of the gate region.

Figure 5:
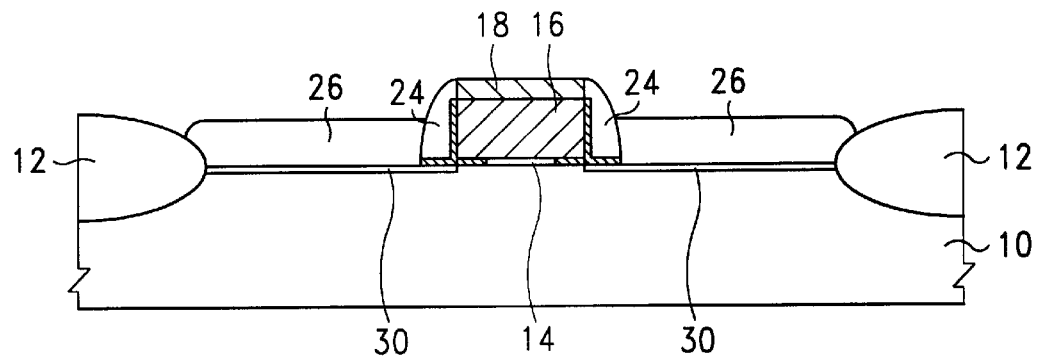
FIG. 5 illustrates a cross sectional view of forming a second silicon layer over the semiconductor substrate with a selective silicon deposition process in accordance with the present invention.

Referring to FIG. 5, after the formation of the silicon nitride spacers, a second silicon layer 26 is then formed on the exposed surface of the semiconductor substrate 10, namely the region between the gate structure with sidewall spacers 24 and the field oxide isolation 12. In the preferred embodiments, the second silicon layer 26 is an undoped polysilicon layer, and is formed with selective epitaxial silicon process, which is performed with a chemical vapor deposition (CVD) process in an ultra high vacuum (UHV) environment. Therefore, the second silicon layer 26 is formed by a single step deposition with the employment of any etch process.

Figure 6:
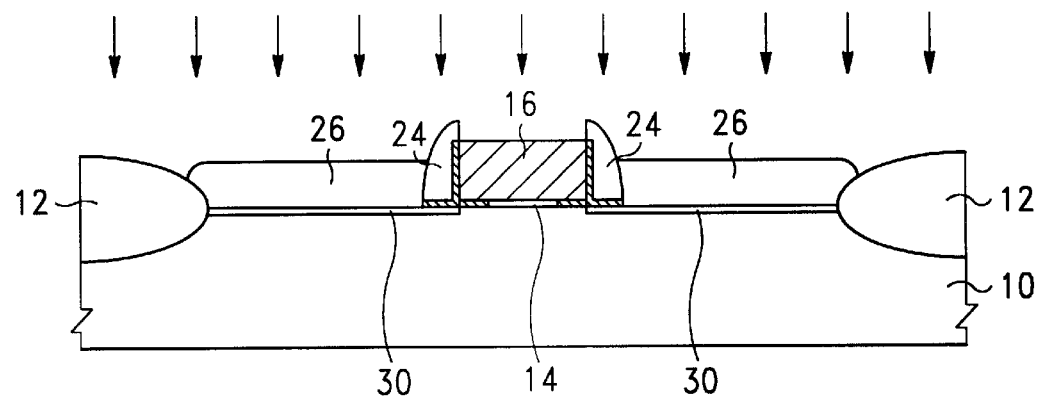
FIG. 6 illustrates a cross sectional view of removing the first dielectric layer and doping the first silicon layer and the second silicon layer to provide dopants for forming a source/drain junction in accordance with the present invention.

Turning to FIG. 6, the first dielectric layer 18 is removed. In the case of using silicon oxide as the first dielectric layer 18, a wet etch using diluted hydrofluoric acid (HF) solution or buffered oxide etchant (BOE) is applied to remove the first dielectric layer 18. Therefore, the sidewall spacers 24 of silicon nitride can be kept from etch under the relative etch selectivity.

After the removal of the first dielectric layer 18, a doping step can be preferably carried out to dope the first silicon layer 16 to increase the conductivity, and also dope the second silicon layer 26 to provide dopants for forming a source/drain junction in the substrate 10 under a region uncovered by the gate region and the undoped spacer structure 24, when the dopants are diffused downward in a later thermal processing step. The doping step can be performed by an ion implantation process. In the case of forming nMOSFETs, the ion implantation process can be performed by implanting phosphorus or arsenic ions at an energy between about 10 to 150 KeV, preferably for having a dosage of about 5E14 to 5E16 ions/cm$^2$ in the source/drain junction after the dopants are diffused. Alternatively, boron ions can employed to replace phosphorus or arsenic ions in the method mentioned above, in order to fabricate pMOSFETs.

Figure 7:
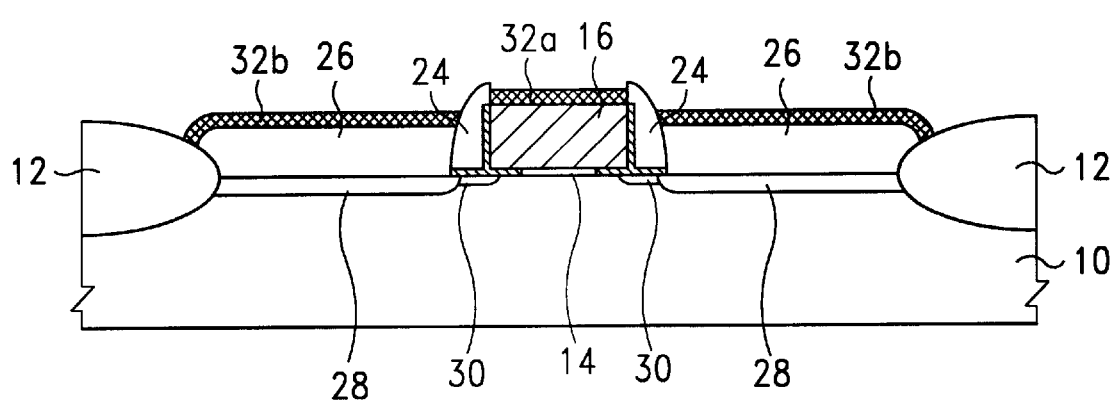
FIG. 7 illustrates a cross sectional view of forming a metal silicide layer on the gate region and the source/drain junction region in accordance with the present invention.

Finally, a self-aligned silicide (salicide) technology is utilized to complete the method of the present invention. A metal layer is formed on the semiconductor substrate 10 using the method like a chemical vapor deposition or a sputtering process. The metal layer generally with a thickness of about 100 angstroms to 1000 angstroms. A material like Ti, Co, W, Ni, Pt, and etc. can be used. Then a thermal annealing process, preferably a rapid thermal process in a nitrogen ambient with a temperature of about 600° C. to 1000° C., is performed to the semiconductor substrate 10. The thermal annealing process diffuses and activates dopants in the extended source/drain junction 30 and in the second silicon layer 26 to form the source/drain junction 28, as shown in FIG. 7. At the same time, the thermal annealing process also drives the reaction between the silicon and the metal layer to form the metal silicide regions 32b and 32a respectively on the second silicon layer 26 and the first silicon layer 16 of the gate structure.

After the metal silicide 32a and 32b are formed on the region with silicon surface, the unreacted metal layer are then removed to finish the salicidation process. As an example, the removal of the unreacted metal layer can be achieved by an wet etching using a solution containing $NH_4OH$, $H_2O$, and $H_2O_2$.

A MOSFET having an elevated source/drain and solid phase diffused source/drain extension is formed by the method provided in the present invention. The elevated source/drain junction is formed with an ultra-shallow dimension and good uniformity by employing the implantation through the second polysilicon layer. The short channel effects is greatly suppressed by using the elevated shallow junction. The operational characteristics of the devices can be raised. An extended ultra-shallow source/drain junction is formed by using the plasma immersion process or the low energy implantation. The unwanted effects accompanying with the narrowed channel region of the small size devices are eliminated by the extended ultra-shallow junction.

As is understood by a person skilled in the art, the foregoing descriptions of the prefcrred embodiment of the present invention is an illustration of the present invention rather than a limitation thereon. It is intended to cover various modifications and similar arrangements included within the spirit and scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A method of forming a transistor over a semiconductor substrate, said method comprising the steps of:

forming a gate insulator layer over said semiconductor substrate;

forming a first silicon layer over said gate insulator layer;

forming an first dielectric layer over said first silicon layer;

removing a portion of said gate insulator layer, of said first silicon layer, and of said first dielectric layer for defining a gate region;

doping said substrate to form an extended source/drain junction in said substrate under a region uncovered by said gate region;

forming an undoped spacer structure on sidewalls of said gate region;

forming a second silicon layer on said semiconductor substrate;

removing said first dielectric layer;

doping said first silicon layer and said second silicon layer to provide dopants for forming a source/drain junction in said substrate under a region uncovered by said gate region and said undoped spacer structure;

forming a metal layer over said semiconductor substrate;

performing a thermal process to said semiconductor substrate, in order to diffuse and activate dopants in said extended source/drain junction and in said second silicon layer to form said source/drain junction, and to form a metal silicide layer on said second silicon layer and said first silicon layer; and removing unreacted portion of said metal layer.

2. The method of claim 1, wherein said gate insulator layer comprises a silicon oxide layer which is thermally grown in an oxygen containing ambient from said semiconductor substrate with a thickness of about 15 angstroms to 300 angstroms.

3. The method of claim 1, wherein said first silicon layer comprises an undoped polysilicon layer deposited with a thickness of about 300 angstroms to 4000 angstroms.

4. The method of claim 1, wherein said first silicon layer comprises an doped polysilicon layer deposited with a thickness of about 300 angstroms to 4000 angstroms.

5. The method of claim 1, wherein said first dielectric layer comprises a silicon oxide layer formed by a chemical vapor deposition to have a thickness between about 300 to 1500 angstroms.

6. The method of claim 1, wherein said undoped spacer structure comprises silicon nitride spacers.

7. The method of claim 1, wherein said second silicon layer is deposited with a selective epitaxial process.

8. The method of claim 1, wherein said doping step for forming said extended source/drain junction is performed with a plasma immersion process.

9. The method of claim 1, wherein said doping step for forming said extended source/drain regions is performed with a low energy ion implantation process with an energy between about 0.1 to 5 KeV.

10. The method of claim 1, wherein said metal layer is selected from the group consisting of Ti, Co, W, Ni and Pt.

11. The method of claim 1, wherein said thermal process for forming said metal silicide layer is performed with a rapid thermal process in a nitrogen ambient with a temperature of about 600° C. to 1,000° C.

12. The method of claim 1, wherein said step of removing said uiireacted ortion of said metal layer is carried out by a wet etching of a solution containing $H_4OH$, $H_2O$, and $H_2O_2$.

13. The method of claim 1 further comprising the step of thermally growing a second dielectric layer on said substrate after said doping step for forming said extended source/drain regions is performed.

14. A method of forming a transistor over a semiconductor substrate, said method comprising the steps of:

forming a gate insulator layer over said semiconductor substrate;

forming a first silicon layer over said gate insulator layer;

forming an first dielectric layer over said first silicon layer, said first dielectric layer comprising silicon oxide;

removing a portion of said gate insulator layer, of said first silicon layer, and of said first dielectric layer for defining a gate region;

doping said substrate to form an extended source/drain junction in said substrate under a region uncovered by said gate region, with a low energy ion implantation process with an energy between about 0.1 to 5 KeV;

thermally growing a second dielectric layer on said substrate and sidewalls of said first silicon layer;

forming an undoped spacer structure on sidewalls of said gate region, said undoped spacer structure comprising silicon nitride spacers;

forming a second silicon layer on said semiconductor substrate, said second silicon layer being deposited with a selective epitaxial process;

removing said first dielectric layer;

doping said first silicon layer and said second silicon layer to provide dopants for forming a source/drain junction in said substrate under a region uncovered by said gate region and said undoped spacer structure;

forming a metal layer over said semiconductor substrate;

performing a thermal process to said semiconductor substrate, in order to diffuse and activate dopants in said extended source/drain junction and in said second silicon layer to form said source/drain junction, and to form a metal silicide layer on said second silicon layer and said first silicon layer; and removing unreacted portion of said metal layer.

15. The method of claim 14, wherein said gate insulator layer comprises a silicon oxide layer which is thermally grown in an oxygen containing ambient from said semiconductor substrate with a thickness of about 15 angstroms to 300 angstroms.

16. The method of claim 14, wherein said first silicon layer comprises an undoped polysilicon layer deposited with a thickness of about 300 angstroms to 4000 angstroms.

17. The method of claim 14, wherein said first silicon layer comprises an doped polysilicon layer deposited with a thickness of about 300 angstroms to 4000 angstroms.

18. The method of claim 14, wherein said first dielectric layer is formed by a chemical vapor deposition to have a thickness between about 300 to 1500 angstroms.

19. The method of claim 14, wherein said removing said portion of gate insulator layer, of said first silicon layer, and of said first dielectric layer comprises the steps of:

forming a photoresist layer over said anti-reflection layer;

defining a gate pattern on said photoresist layer; and performing a reactive ion etching (RIE) using said gate pattern as a mask, to remove said portion of gate insulator layer, of said first silicon layer, and of said first dielectric layer to define said gate region.

* * * * *